(12) United States Patent
Takeoka et al.

(10) Patent No.: US 7,302,658 B2
(45) Date of Patent: Nov. 27, 2007

(54) METHODS FOR EVALUATING QUALITY OF TEST SEQUENCES FOR DELAY FAULTS AND RELATED TECHNOLOGY

(75) Inventors: Sadami Takeoka, Osaka (JP); Mitsuyasu Ohta, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 382 days.

(21) Appl. No.: 10/765,276

(22) Filed: Jan. 28, 2004

(65) Prior Publication Data
US 2005/0010839 A1  Jan. 13, 2005

(30) Foreign Application Priority Data
Jan. 28, 2003 (JP) .............................. P2003-18428

(51) Int. Cl.
*G06F 17/50* (2006.01)
(52) U.S. Cl. ................... 716/6; 716/4; 716/5
(58) Field of Classification Search ............... 716/4–6; 702/58, 59, 117–119, 185, 189; 324/238, 324/500, 512, 527; 714/700, 744
See application file for complete search history.

(56) References Cited

U.S. PATENT DOCUMENTS 5,748,646 A  5/1998 Hosokawa 6,453,437 B1 *  9/2002 Kapur et al. ................. 714/741
6,708,139 B2 *  3/2004 Rearick et al. ............. 702/185

OTHER PUBLICATIONS

Iyengar et al., "Delay test Generation 1—Concepts and Coverage Metrics," IEEE, 1988, pp. 857-866.*
Heragu et al., "Segment Delay Faults: A New Fault Model," IEEE, 1996, pp. 39.*

* cited by examiner

*Primary Examiner*—Vuthe Siek
(74) *Attorney, Agent, or Firm*—McDermott Will & Emery LLP

(57) ABSTRACT

In evaluating of the quality of test sequences for delay faults, when all the delay faults are equally regarded, the process of detecting the delay faults deserving to be detected and those not so deserving to be detected cannot be reflected on the quality evaluation for the test sequences. To solve the problem, a "design delay value" on a signal path, on which a corresponding delay fault is defined, is weighted. This invention thus provides "methods of evaluating the quality of test sequences for delay faults" capable of evaluating the quality of the "delay fault test sequences" with more accuracy.

18 Claims, 13 Drawing Sheets

(method of generating test sequence for delay fault)

(method of simulating delay fault)

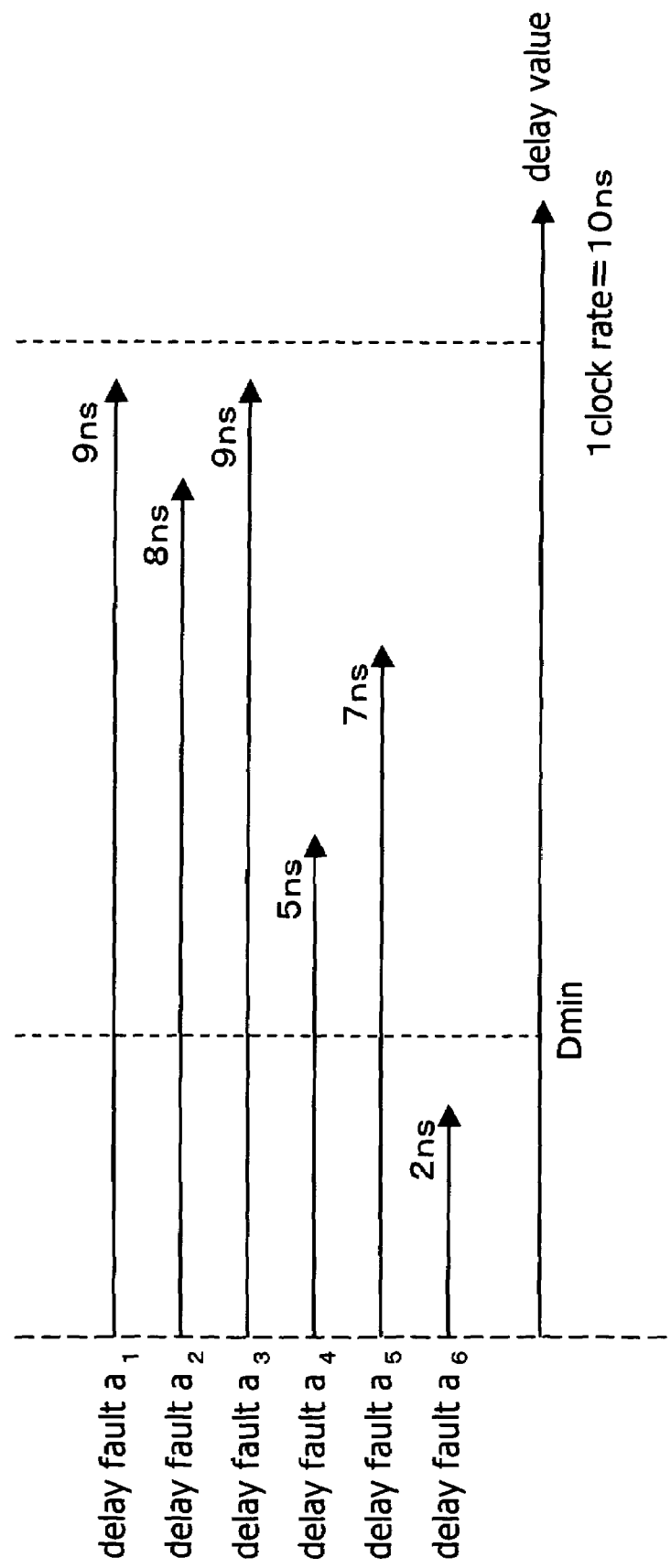
F I G. 5

METHODS FOR EVALUATING QUALITY OF TEST SEQUENCES FOR DELAY FAULTS AND RELATED TECHNOLOGY

BACKGROUND OF THE INVENTION

This invention relates to a technology for evaluating the quality of test sequences, which represents the performance in testing faults, for semiconductor integrated circuits. The technology is used in testing delay faults on the semiconductor integrated circuits.

A recent fast-paced advancement in a miniaturization technology for semiconductor process is rapidly leading to the semiconductor integrated circuits in a larger size and more complex configuration, which is making it even more difficult for the semiconductor integrated circuits to be tested. In order to deal with the problem, the design for testability method, such as scan testing, has been in use as a measure to facilitate the tests for the semiconductor integrated circuits. Faults presented in a stuck-at fault model can be now efficiently tested. When the faults according to the stuck-at fault model are detected, the performance of the detection does not depend on a clock frequency. Therefore, the scan test is generally implemented with a slower clock frequency than an actual operation speed.

As a result of more and more apparent variability in the semiconductor process along with the advancing miniaturization thereof, however, it is becoming too difficult for the use of the lower clock frequency to guarantee an expected quality of the tests. There is now a call for a delay fault test such as a technology to enable a test using a clock frequency same as in the actual operation.

A fault coverage representing the quality of the delay fault test sequences is calculated according to the following formula.

Formula 1
$$\text{fault coverage} = \frac{\text{number of detected faults}}{\text{number of all defined faults}} \times 100\%$$

In the fault coverage 1, an equal importance is placed on all the delay faults, which arises a problem that the fault coverage does not quite reflect the quality of the test sequences in real fault detection. The problem is described below referring to the drawing.

FIG. 14 illustrates the characteristics of delay faults defined on a semiconductor integrated circuit. The lengths of respective arrows extending from signal paths $b_1$-$b_6$ denote "design delay values on the respective signal paths". A "design delay value" means a delay value when the semiconductor integrated circuit is designed. The vertical dotted line on the right side of FIG. 14 denotes a value of one clock rate on the semiconductor integrated circuit. In general, the larger the "design delay value on the signal path" is (the closer to one clock rate), the more likely the signal path induces a delay fault. From this aspect, it is obvious that, in FIG. 14, the signal path $b_3$ is more likely than $b_6$ to induce a delay fault. Therefore, it can be said that a test for detecting the delay fault defined on the signal path $b_3$ has a higher quality than a test for detecting the delay fault defined on the signal path $b_6$.

According to the fault coverage obtained by the formula 1, it is interpreted that the delay fault detections for the signal path $b_3$ and signal path $b_6$ are equivalent in that a delay fault is found therein and therefore share the same quality. For example, assuming that a delay fault is defined on each of the signal paths $b_1$-$b_6$, the fault coverage in the case of detecting the delay faults on the signal paths $b_1$-$b_3$ having more likelihood of failure is:

$$(3/6) \times 100(\%) = 50\%$$

The fault coverage, on the other hand, in the case of detecting the delay faults on the signal paths $b_4$-$b_6$ having less likelihood of failure is also:

$$(3/6) \times 100(\%) = 50\%$$

The signal paths $b_1$-$b_3$ and $b_4$-$b_6$ are different in likelihood of actual failure, however share the same fault coverage.

Having the fault detection tests for the signal paths $b_1$-$b_3$ having the larger delay values and for the signal paths $b_4$-$b_6$ having the smaller delay values compared to each other, the former obviously has a higher quality. Thus, the formula 1 to provide the fault coverage does not correctly reflect the test quality. As a result, the test sequences used for fault detection are wrongly evaluated.

SUMMARY OF THE INVENTION

Therefore, a main object of the present invention is to provide "methods of evaluating the quality of test sequences for delay faults" capable of more accurately evaluating the quality of the delay fault test sequences.

These and other objects and aspects as well as advantages of the invention will become clear by the following description.

In order to achieve the foregoing object, the present invention implements the following measures.

As a first solution, in a "method of evaluating the quality of the delay fault test sequences" according to the present invention, of all defined delay faults, any delay fault with a delay value equal to or below a predetermined design delay value is excluded from a test object, and the number of the remaining delay faults is set as a comparison denominator. The target for comparison is the number of delay faults detected by the "delay fault test sequences". The proportion of the comparison target to the comparison denominator is the fault coverage, based on which the quality of the delay fault test sequences is evaluated.

The operation of the method configured as described is as follows. The levels of importance in the defined delay faults are not regarded equal to one another. The fault coverage is calculated with the delay faults having a lower impact on the quality evaluation excluded from the test object. Because the "delay fault test sequences" are evaluated in quality based on the fault coverage calculated as described, the delay faults having more likelihood of actual failure can have a more impact on the fault coverage. As a result, the quality of the delay fault test sequences can be more accurately evaluated.

As a second solution, in a "method of evaluating the quality of the delay fault test sequences" according to the present invention, each of the defined delay faults is weighted. The total of the weights with respect to the delay faults is the comparison denominator. The target for comparison is the total of the weights with respect to the delay faults detected by the "delay fault test sequences". The proportion of the comparison target to the comparison denominator is the fault coverage, based on which the quality of the "delay fault test sequences" is evaluated.

The operation of the method configured as described is as follows. The levels of importance in the defined delay faults are not regarded equal to one another. The defined delay faults are weighted in compliance with the levels of the impact thereof on the quality evaluation, wherein the totals of the weights are the criteria for calculating the fault coverage. The quality evaluation for the "delay fault test sequences" is carried out based on the thus calculated fault coverage. Therefore, the delay faults having more likelihood of actual failure can have more impact on the fault coverage. As a result, the quality of the delay fault test sequences can be more accurately evaluated.

There are different modes of the described weight.

In one of the modes, the "design delay value on the delay fault defined signal path" is used as an indicator denoting the level of the "design delay value on the delay fault defined signal path" with respect to a "timing design request value on the "delay fault defined signal path". There is provided a plurality of delay faults $a_1$-$a_n$, "design delay values" of which are respectively $T_1$-$T_n$. Of the delay faults $a_1$-$a_n$, the "design delay values" of delay faults detected by the "delay fault test sequences" are $t_1$-$t_m$ ($m \leq n$). When the total of the delay values $T_1$-$T_n$ is $\sigma_T$, and the total of the detected delay values $t_1$-$t_m$ is $\sigma_t$, the fault coverage $\eta$ is: $\eta = \sigma_t/\sigma_T$.

Formula 2

$$\sigma_T = \sum_{i=1}^{n} T_i$$

Formula 3

$$\sigma_t = \sum_{j=1}^{m} t_j$$

Formula 4

$$\eta = \frac{\sigma_t}{\sigma_T} = \frac{\sum_{j=1}^{m} t_j}{\sum_{i=1}^{n} T_i}$$

In the first solution, the delay faults having a lower impact on the quality evaluation are excluded. This solution, in which the defined delay faults are weighted, does not require such exclusion. The delay value of any defined delay fault is reflected on the fault coverage. The quality of the "delay fault test sequences" can be more accurately evaluated.

The delay values $T_i$ and $T_j$ can be respectively replaced by gate stage numbers with respect to the delay faults $a_i$ and $a_j$.

In another mode, the product of the "design delay value on the delay fault defined signal path" and a "physical path length on the delay fault defined signal path" is used as the weight. The "physical path lengths on the signal paths" respectively for a plurality of delay faults $a_1$-$a_n$ are $Q_1$-$Q_n$. The "physical path lengths on the signal paths" respectively for the delay faults detected by the "delay fault test sequences" are $q_1$-$q_m$ ($m \leq n$). The respective products of the delay values $T_1$-$T_n$ and path lengths $Q_1$-$Q_n$ are $T_1 \cdot Q_1$-$T_n \cdot Q_n$. The total of the products is $\sigma_Q$. The respective products of the delay values $t_1$-$t_m$ and path lengths $q_1$-$q_m$ are $t_1 \cdot q_1$-$t_m \cdot q_m$. The total of the products is $\sigma_q$. The fault coverage $\eta$ is: $\eta = \sigma_q/\sigma_Q$.

Formula 5

$$\sigma_Q = \sum_{i=1}^{n} (T_i \times Q_i)$$

-continued

Formula 6

$$\sigma_q = \sum_{j=1}^{m} (t_j \times q_j)$$

Formula 7

$$\eta = \frac{\sigma_q}{\sigma_Q} = \frac{\sum_{j=1}^{m} (t_j \times q_j)}{\sum_{i=1}^{n} (T_i \times Q_i)}$$

Again in this case, the delay faults having a lower impact on the quality evaluation are not excluded. The delay values of all the defined delay faults are reflected on the fault coverage. Further, the two factors, delay value and path length, are presented for multiplication. Accordingly, the quality evaluation for the "delay fault test sequences" can be further accurate.

In still another mode, the product of the "design delay value on the delay fault defined signal path" and a "physical wiring area on the delay fault defined signal path" is used as the weight. The physical wiring areas on the signal paths respectively for a plurality of delay faults $a_1$-$a_n$ are $H_1$-$H_n$, and the "physical wirings areas on the signal paths" respectively for the delay faults detected by the "delay fault test sequences" are $h_1$-$h_m$ ($m \leq n$). The respective products of the delay values $T_1$-$T_n$ and wiring areas $H_1$-$H_n$ are $T_1 \cdot H_1$-$T_n \cdot H_n$. The total of the products is $\sigma_H$. The products of the respective $t_1$-$t_m$ and wiring areas $h_1$-$h_m$ are $t_1 \cdot h_1$-$t_m \cdot h_m$. The total of the products is $\sigma_h$. The fault coverage $\eta$ is $\eta = \sigma_h/\sigma_H$.

Formula 8

$$\sigma_H = \sum_{i=1}^{n} (T_i \times H_i)$$

Formula 9

$$\sigma_h = \sum_{j=1}^{m} (t_j \times h_j)$$

Formula 10

$$\eta = \frac{\sigma_h}{\sigma_H} = \frac{\sum_{j=1}^{m} (t_j \times h_j)}{\sum_{i=1}^{n} (T_i \times H_i)}$$

Again in this case, the delay faults having a lower impact on the quality evaluation are not excluded. The delay values of all the defined delay faults are reflected on the fault coverage. Further, the two factors, the delay value and wiring area, are presented for multiplication. Accordingly, the quality evaluation for the "delay fault test sequences" can be further accurate.

In still another mode, the product of the following two factors is used as the weight. One of the factors is the "design delay value on the delay fault defined signal path". The other is the "wiring area on the delay fault defined signal path" added by an element area. More specifically:

$$\text{design delay value on signal path} \times \left\{ \text{physical wiring area} + \text{element area} \right\} = \text{weight}$$

The physical wiring areas on the signal paths respectively for a plurality of delay faults $a_1$-$a_n$ are $H_1$-$H_n$, and the respective element areas thereon (gate areas) are $G_1$-$G_n$. The physical wiring areas on the signal paths respectively for the delay faults detected by the delay fault test sequences are $h_1$-$h_m$, and the respective element areas thereon (gate areas) are $g_1$-$g_m$ ($m \leq n$). The sums of the respective wiring areas $H_1$-$H_n$ and gate areas $G_1$-$G_n$ multiplied by the respective delay values $T_1$-$T_n$ equal to $T_1 \cdot (H_1+G_1)$-$T_n \cdot (H_n+G_n)$. The total of the products is $\sigma_{HG}$. The sums of the respective wiring areas $h_1$-$h_m$ and the gate areas $g_1$-$g_m$ multiplied by the respective delay values $t_1$-$t_m$ equal to $t_1 \cdot (h_1+g_1)$-$t_m \cdot (h_m+G_m)$. The total of the products is $\sigma_{hg}$. The fault coverage $\eta$ is: $\eta = \sigma_{hg}/\sigma_{HG}$.

Formula 11
$$\sigma_{HG} = \sum_{i=1}^{n} \{T_i \times (H_i + G_i)\}$$

Formula 12
$$\sigma_{hg} = \sum_{j=1}^{m} \{t_j \times (h_j + g_j)\}$$

Formula 13
$$\eta = \frac{\sigma_{hg}}{\sigma_{HG}} = \frac{\sum_{j=1}^{m} \{t_j \times (h_j + g_j)\}}{\sum_{i=1}^{n} \{T_i \times (H_i + G_i)\}}$$

Again in this case, the delay faults having a lower impact on the quality evaluation are not excluded. The delay values of all the defined delay faults are reflected on the fault coverage. Further, the three factors, wiring area, element area and delay value, are presented for multiplication. Accordingly, the quality evaluation for the "delay fault test sequences" can be further accurate.

As the weight, a defect density may be occasionally presented for multiplication. The defect density is statistically calculated according to a yield analysis conducted in a factory or the like. The defect density is usually constant with respect to different delay faults. However, to add a fine difference between the delay faults can further improve the accuracy in the quality evaluation for the "delay fault test sequences".

Referring to the foregoing "methods of evaluating the quality of the delay fault test sequences", "methods of generating the test sequences for delay faults", according to the present invention, calculate the fault coverage with respect to the generated "delay fault test sequences" using any of the foregoing "methods of evaluating the quality of the delay fault test sequences". This, in contrast to the conventional technology, enables the "delay fault test sequences" to be more accurately generated.

Referring to the foregoing "methods of evaluating the quality of the delay fault test sequences", "methods of simulating delay faults", according to the present invention, calculate the fault coverage with respect to the given "delay fault test sequences" using any of the foregoing "methods of evaluating the quality of the delay fault test sequences". This, in contrast to the conventional technology, enables the delay fault simulation to be more accurate.

Referring to the foregoing "methods of evaluating the quality of the delay fault test sequences", "methods of testing faults", according to the present invention, calculate the fault coverage with respect to the "delay fault test sequences" used in the testing steps for a semiconductor integrated circuit using any of the foregoing "methods of evaluating the quality of the delay fault test sequences". This, in contrast to the conventional technology, enables the semiconductor integrated circuit to be more accurately tested for faults.

The foregoing and other aspects will become apparent from the following description of the invention when considered in conjunction with the accompanying drawing figures.

BRIEF DESCRIPTION OF THE DRAWINGS

FIG. 5 is a chart showing the characteristics of delay faults defined on a semiconductor integrated circuit according to the Embodiment 1 of the present invention.

In all these figures, like components are indicated by the same numerals

DESCRIPTION OF THE PREFERRED EMBODIMENTS

Figure 1:
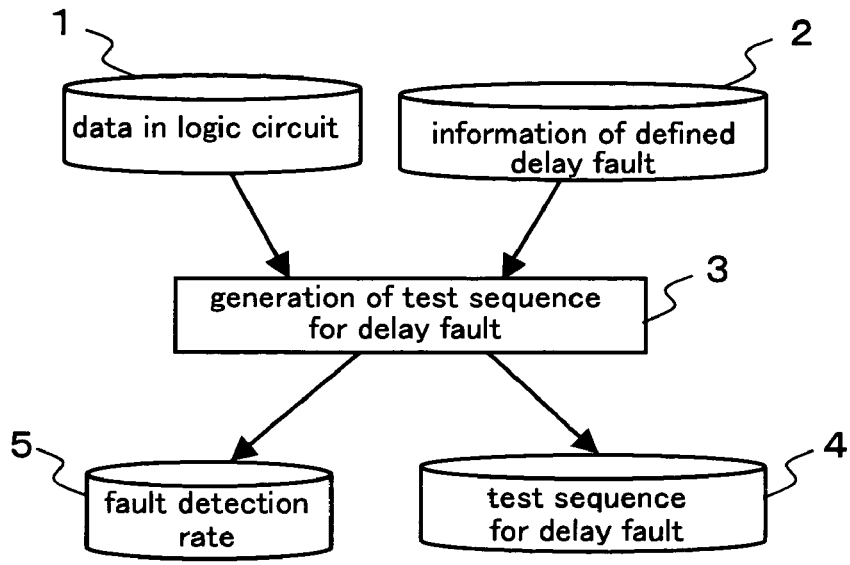
FIG. 1 is a flow chart illustrating a "method of generating test sequences for delay faults" according to an Embodiment 1 of the present invention.

Hereinafter, preferred embodiments according to the present invention are described referring to the drawings.

In general, there are two kinds of delay faults on a signal path, which are faults in rising transition and faults in falling transition. The delay faults are described in combination of the signal path and either of the transitions. In this specification, however, the transitions are omitted for descriptive convenience, and the present invention is described therein on the grounds that a delay fault is defined on a signal path.

Embodiment 1

According to an Embodiment 1 of the present invention, any fault having a less importance in terms of delay fault detection is excluded from the target of quality evaluation for "test sequences for delay faults". In this manner, the accuracy of the quality evaluation for the "delay fault test sequences" is improved.

First, examples of a method of evaluating the quality of generated "delay fault test sequences" according to the embodiment are described.

Quality Evaluation for "Delay Fault Test Sequences"

FIG. 1 is a flow chart illustrating a "method of generating test sequences for delay faults" according to an Embodiment 1 of the present invention. A numeral 1 is "data in a logic circuit" to be tested. A numeral 2 is "defined delay fault information" on delay faults defined in the logic circuit. A numeral 3 is "operation of test sequence generation for delay faults". A numeral 4 is "delay fault test sequences" for testing delay faults in the logic circuit. A numeral 5 is a fault coverage resulting from the "operation of test sequence generation for delay faults".

Figure 3:
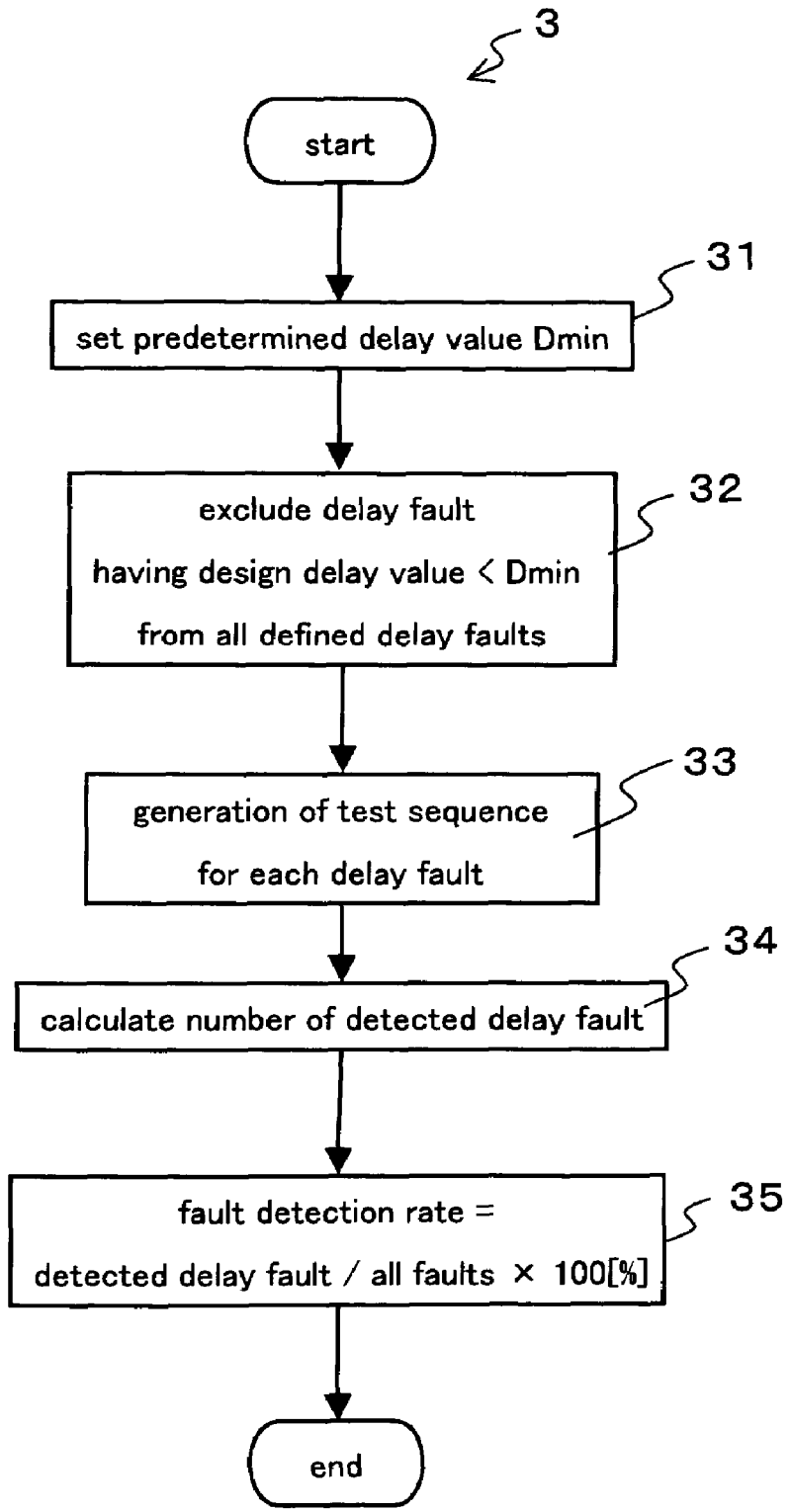
FIG. 3 is a flow chart showing the specific illustration of "operation of the test sequence generation for delay faults" of FIG. 1 according to the Embodiment 1 of the present invention.

FIG. 3 is a flow chart showing the specific illustration of the "operation of test sequence generation for delay faults" 3. A numeral 31 is setting of a predetermined delay value Dmin. A numeral 32 is operation of exclusion from all the defined delay faults of any "design delay value on the delay fault defined signal path" having a delay value smaller than the predetermined delay value Dmin. A numeral 33 is "operation of test sequence generation" for the respective defined delay faults. A numeral 34 is "operation of counting of the detected delay faults". A numeral 35 is operation of a fault-coverage calculation according to the following formula:

$$\text{Formula 14}$$
$$\text{fault coverage} = \frac{\text{number of detected faults}}{\text{number of all faults}} \times 100 \, (\%) \qquad 14$$

In the formula 14, the total number of the faults equals to "all the defined faults" minus "lower-impact faults". "All the defined faults" are defined by the "defined delay fault information" 2. The "lower-impact faults" refer to the faults on the signal paths having the "design delay values on the signal paths" smaller than the predetermined delay value Dmin.

The number of the detected faults is, of all the faults, the number of faults, for which the test sequences are successfully generated in the "operation of test sequence generation" 33.

FIG. 5 is a chart illustrating the characteristics of delay faults defined on a semiconductor integrated circuit. The lengths of arrows extending from delay faults $a_1$-$a_6$ respectively denote the levels of the "design delay values on the delay fault defined signal paths". Numbers appended to the respective arrows such as 9 ns respectively show specific delay values thereof. A vertical dotted line on the right side of FIG. 5 denotes a value of one clock rate on the semiconductor integrated circuit.

Hereinafter, a first example of the embodiment is described referring to FIGS. 1, 3, and 5.

First, the "operation of test sequence generation for delay faults" 3 is implemented using the given "logic circuit data" 1 and the "defined delay fault information" 2.

The "defined delay fault information" 2 includes the delay faults $a_1$-$a_6$ shown in FIG. 5.

In the "operation of test sequence generation for delay faults" 3, the predetermined delay value Dmin is first set in the operation 31. The predetermined delay value Dmin is set to be adequately smaller than the value of one clock rate. The value of one clock rate is now set at 10 ns, while the predetermined delay value Dmin is set at 3 ns.

Next, comparison and judgment are carried out in the operation 32. Of "all the defined delay faults" $a_1$-$a_6$, the "design delay value on the signal path", on which the delay fault $a_6$ is defined, is 2 ns. Because the value is smaller than the predetermined delay value Dmin, the delay fault $a_6$ is excluded. As a result, the delay faults $a_1$-$a_5$ are to be tested.

Further, in the operation 33, the operation of "test sequence generation" is implemented to the delay faults $a_1$-$a_5$. When, as a result, the test sequences are successfully generated (meaning that the faults are detected) for the delay faults $a_4$ and $a_5$ alone, the number of the detected faults is calculated as two in the operation 34.

Finally, the fault coverage is calculated in the step 35 as:

$$(\tfrac{2}{5}) \times 100 = 40\%$$

Then, the data of the fault coverage 5 and generated "delay fault test sequence" 4 are output.

Quality Evaluation for Fault Simulation

Described next is the quality evaluation for the given "delay fault test sequences" in fault simulation according to the embodiment.

Figure 2:
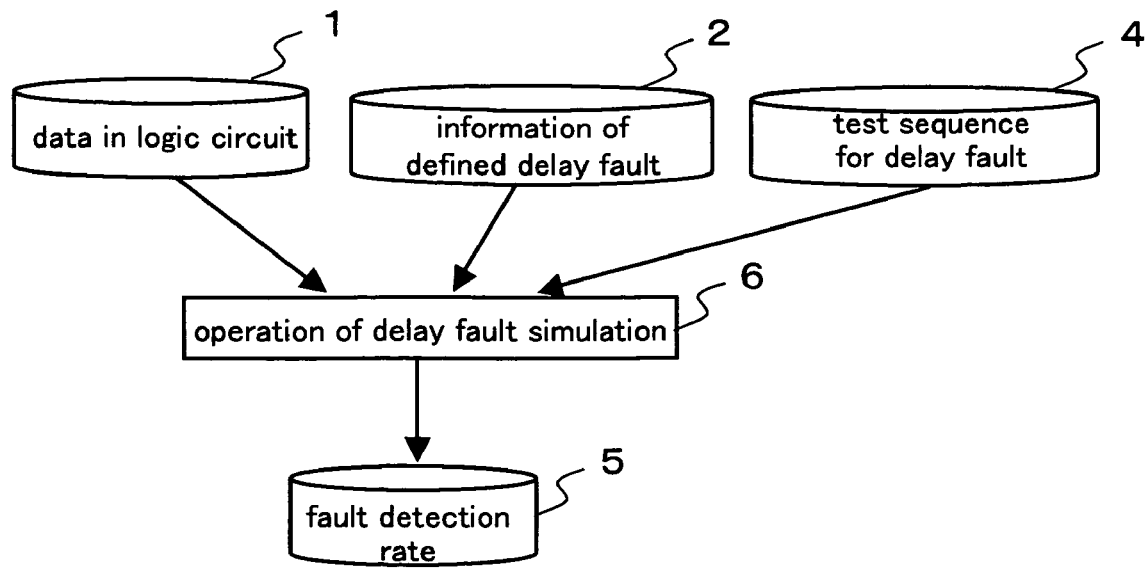
FIG. 2 is a flow chart illustrating a "method of simulating delay faults" according to the Embodiment 1 of the present invention.

FIG. 2 is a flow chart illustrating a "method of simulating delay faults" according to the Embodiment 1 of the present invention. A numeral 6 is "operation of delay fault simulation". Any numeral other than 6 shown therein corresponds to the component with the same numeral appended thereto in FIG. 1.

Figure 4:
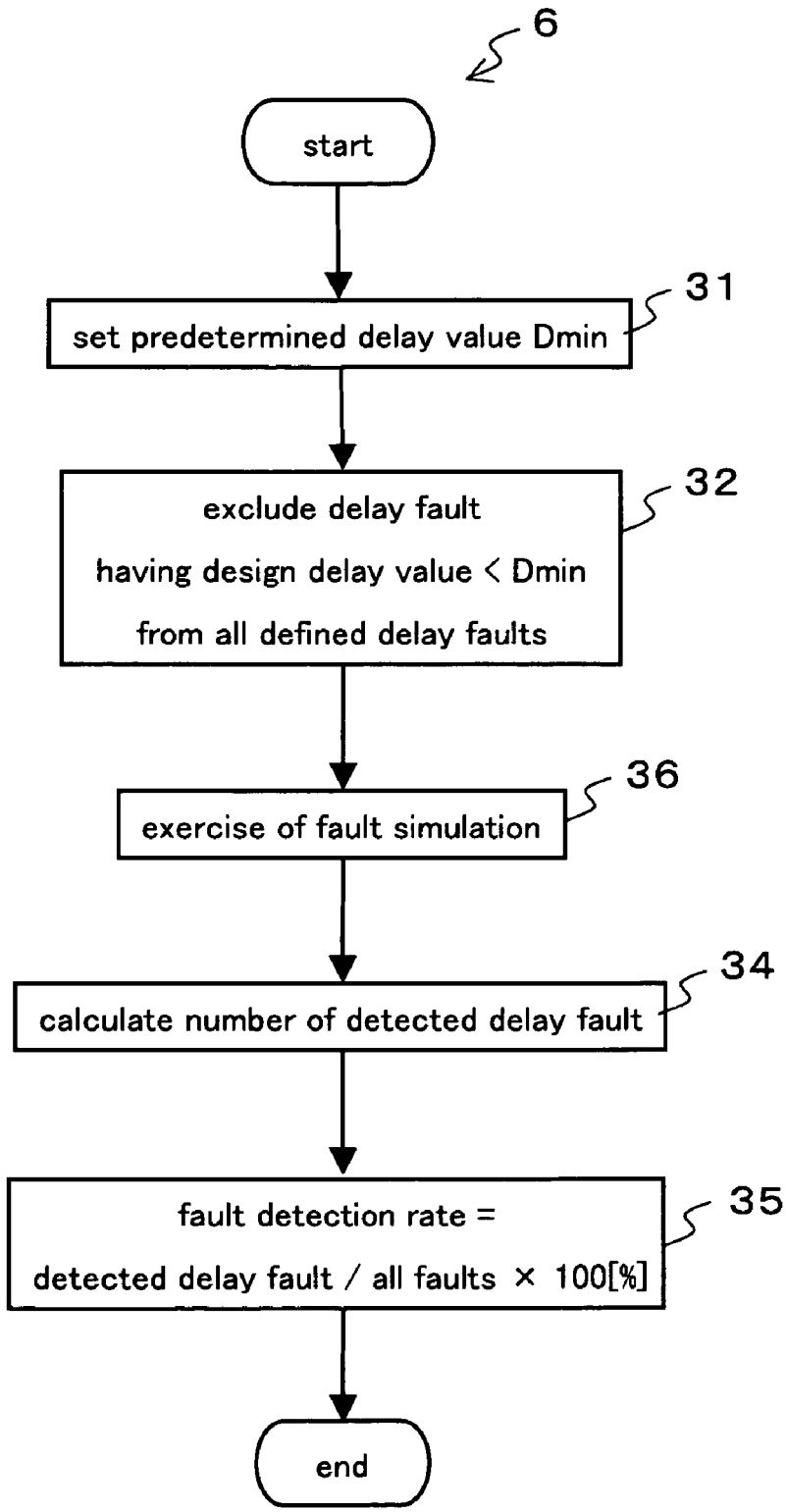
FIG. 4 is a flow chart showing the specific illustration of "operation of the "delay fault simulation" of FIG. 2 according to the Embodiment 1 of the present invention.

FIG. 4 is a flow chart showing the specific illustration of operation of the "delay fault simulation" 6. In FIG. 4, in place of the "operation of test sequence generation" 33 of FIG. 3, "operation of fault simulation exercise" 36 is carried out. Any other operation is the same as in FIG. 3.

Hereinafter, a second example of the embodiment is described referring to FIGS. 2, 4, and 5.

First, the "operation of delay fault simulation" 6 is implemented using the given "logic circuit data" 1, "defined delay fault information" 2, and "delay fault test sequences" 4. The "defined delay fault information" 2 includes the delay faults $a_1$-$a_5$ shown in FIG. 5.

In the "operation of delay fault simulation" 6, the predetermined delay value Dmin is first set in the operation 31. The predetermined delay value Dmin is, as in the first example, is set at 3 ns.

Next, comparison and judgment are carried out in the operation 32. Of the delay faults $a_1$-$a_6$, which are "all the defined faults", the "design delay value on the signal path", on which the delay fault $a_6$ is defined, is 2 ns. Because the value is smaller than the predetermined delay value Dmin, the delay fault $a_6$ is excluded. As a result, the faults to be tested are the delay faults $a_1$-$a_5$.

Further, in the operation 36, the fault simulation is implemented with respect to the delay faults $a_1$-$a_5$ using the "delay fault test sequences" 4. When, as a result, the delay faults $a_4$ and $a_5$ are detected, the operation 34 calculates the number of the detected faults as two.

Finally, the fault coverage is calculated in the operation 35 as:

(2×5)×100=40%

Then, the data from the fault coverage 5 is output.

Evaluation of the Embodiment 1

Next, the embodiment is compared to a conventional technology.

Figure 13:
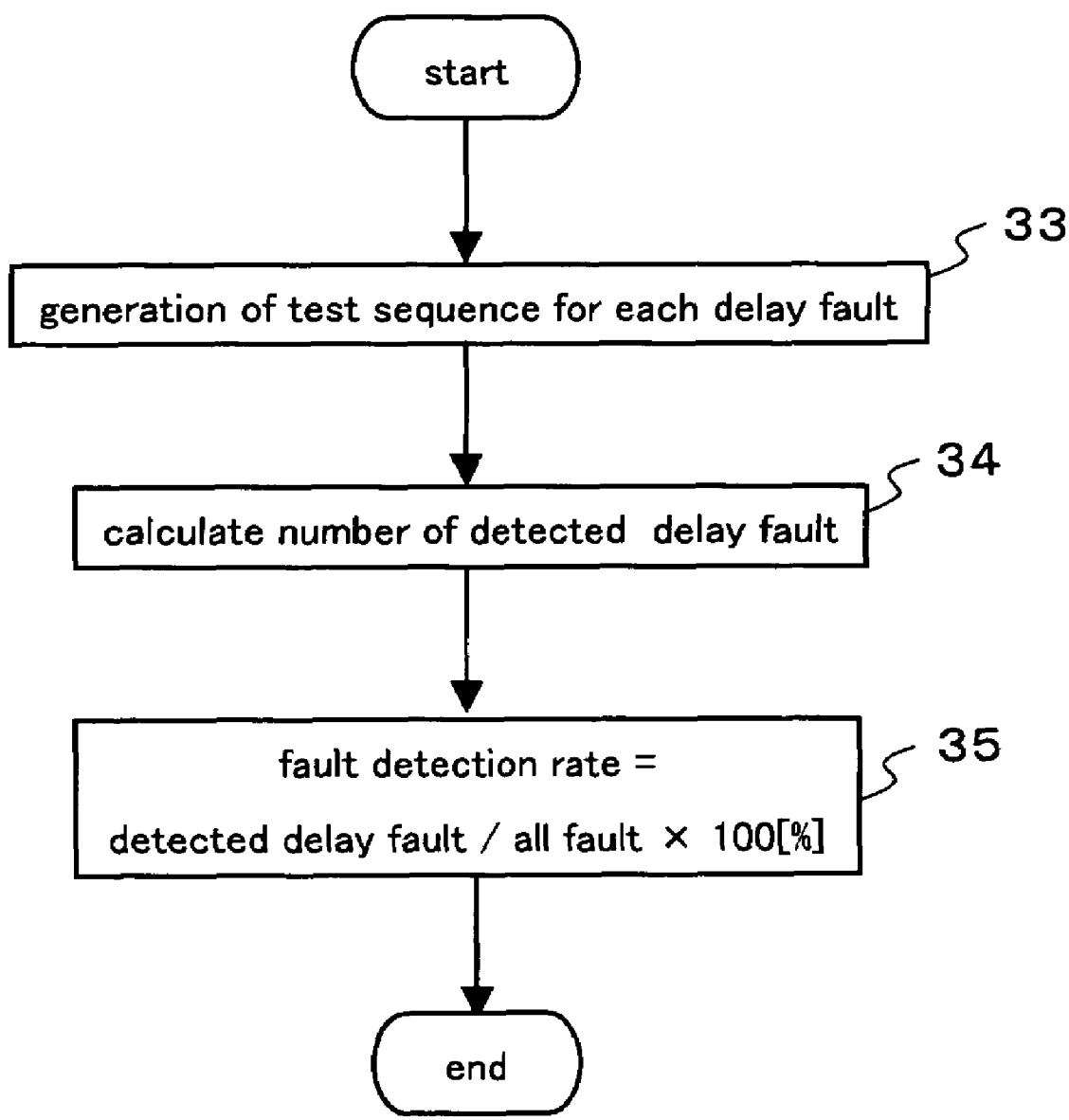
FIG. 13 is a flow chart for describing a "method of generating test sequences for delay faults" according to a conventional technology.
Figure 14:
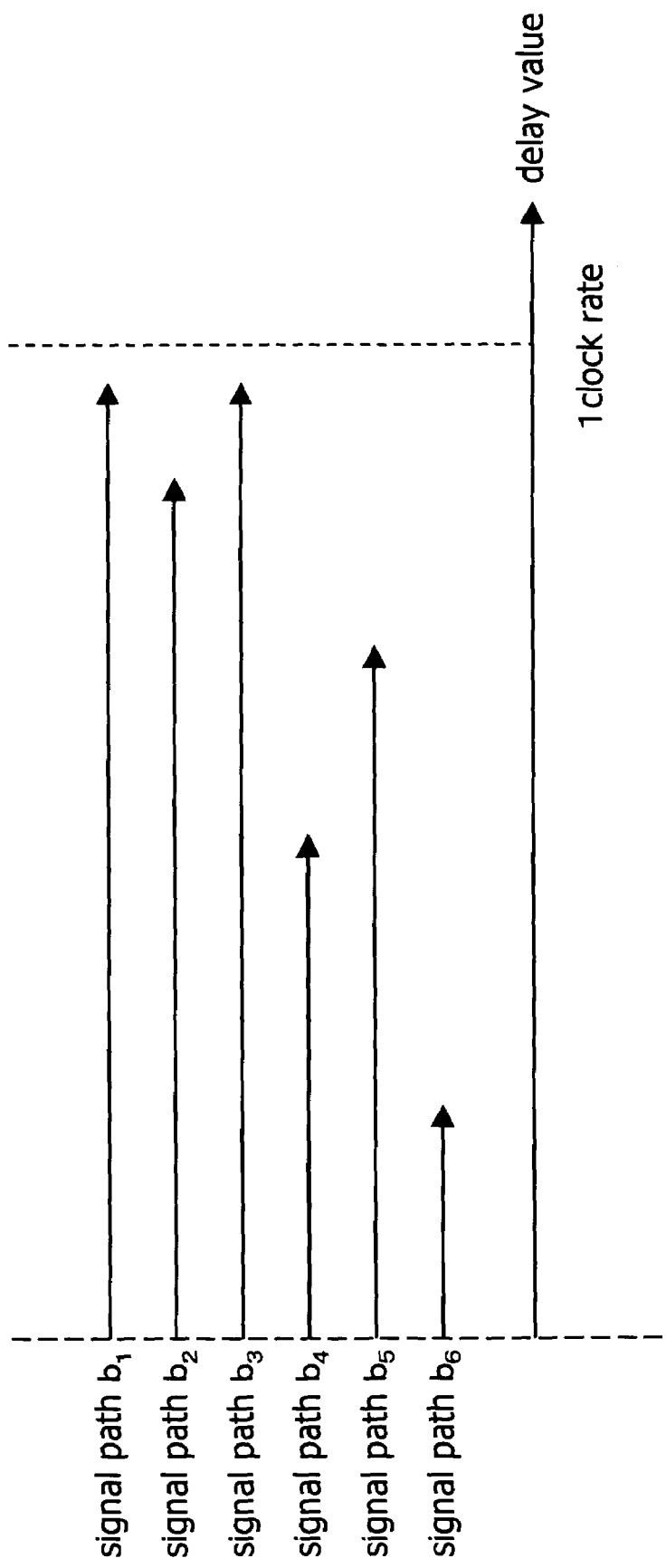
FIG. 14 is a chart showing the characteristics of delay faults defined on a semiconductor integrated circuit according to a conventional technology.

FIG. 13 is a flow chart showing a method of generating "delay fault test sequences" and evaluating the quality of the generated "delay fault test sequence" according to a conventional technology, which corresponds to FIG. 2 of the present invention. Any numeral shown therein corresponds to the component with the same numeral appended thereto in FIG. 2.

Hereinafter, the operation according to the conventional technology is described.

In the conventional technology, the test sequences are to be generated for any given fault provided by the "defined delay fault information" 2. Because of that, the test sequences are generated for the delay faults $a_1$-$a_6$ in the "operation of test sequence generation" 33. When, as a result, the test sequences are successfully generated (meaning that the faults are detected) for the delay faults $a_4$-$a_6$, the number of the detected faults is calculated as three in the operation 34. The fault coverage is calculated in the operation 35 as:

(3/6)×100=50%.

In this case, the delay fault $a_1$ and the delay fault $a_6$ are given an equal importance. The detected faults are only the delay faults $a_4$-$a_6$ having less likelihood of actual failure. The delay faults $a_1$-$a_3$ having more likelihood of actual failure are not detected. Nevertheless, the fault coverage is excessively high because the likelihood of actual failure in each delay fault is not counted for.

Meanwhile, this embodiment excludes the delay fault $a_6$ having less likelihood of actual failure from the test object. In the consequence of that, the likelihood of actual failure is reflected on the fault coverage. The fault coverage is lower than that of the conventional technology meaning that the quality of the "delay fault test sequences" is more accurately evaluated.

Embodiment 2

In an Embodiment 2, the quality of "delay fault test sequences" is evaluated using a "design delay value" on a signal path on which a delay fault is defined. The quality of the "delay fault test sequences" is thus more accurately evaluated.

Figure 6:
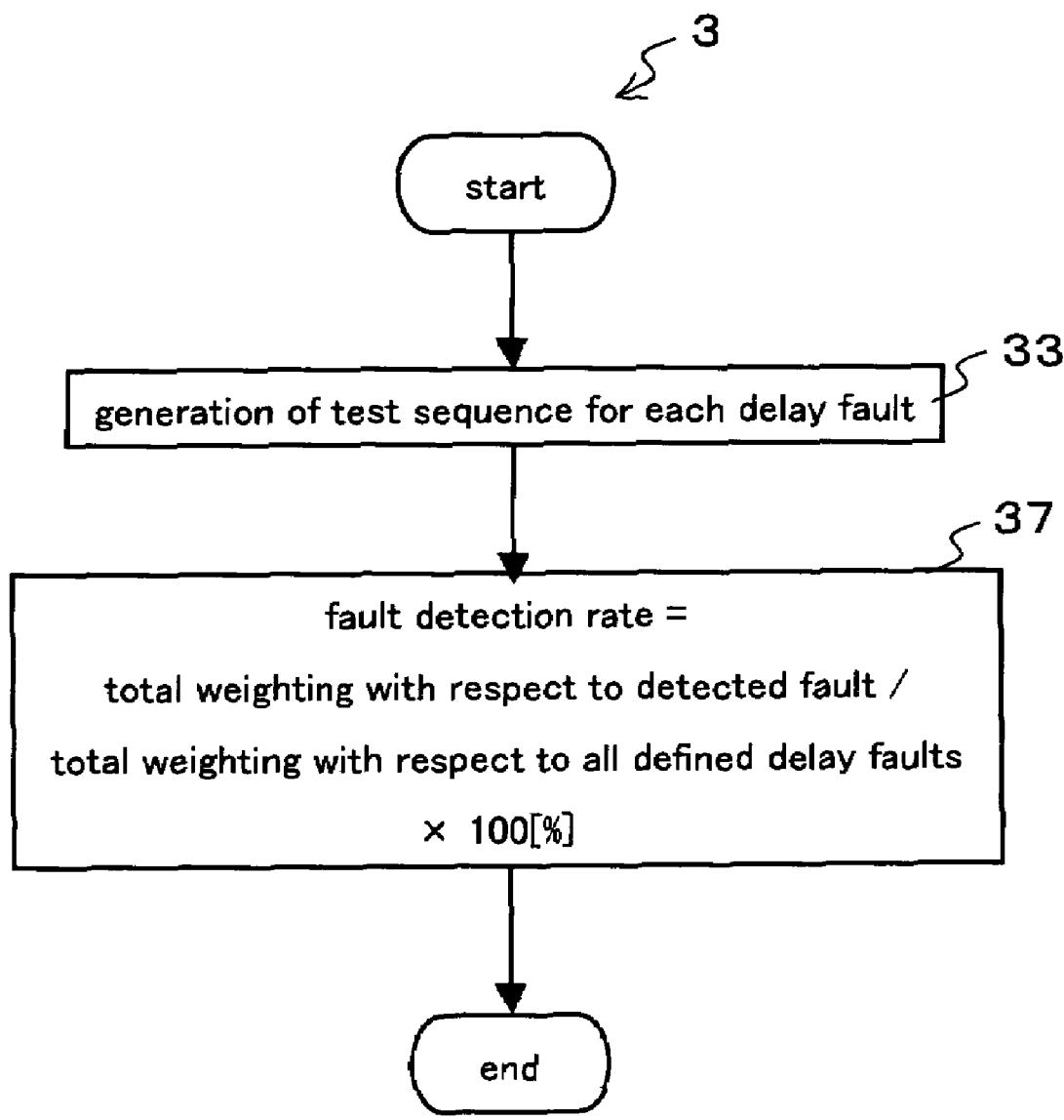
FIG. 6 is a flow chart showing the specific illustration of the "operation of the test sequence generation for delay faults" of FIG. 1 according to an Embodiment 2 of the present invention.

FIG. 6 is a flow chart of a "method of evaluating the quality of "delay fault test sequences" showing the specific illustration of "operation of test sequence generation for delay faults" 3 of FIG. 1. A numeral 33 is "operation of test sequence generation" for generating test sequences for defined delay faults. A numeral 37 is "operation of fault coverage calculation according to the following formula:

$$\text{fault coverage} = \frac{\text{total of weights with respect to respective detected faults}}{\text{total of weights with respect to defined faults}} \times 100\,(\%)$$ (15)

Figure 7:
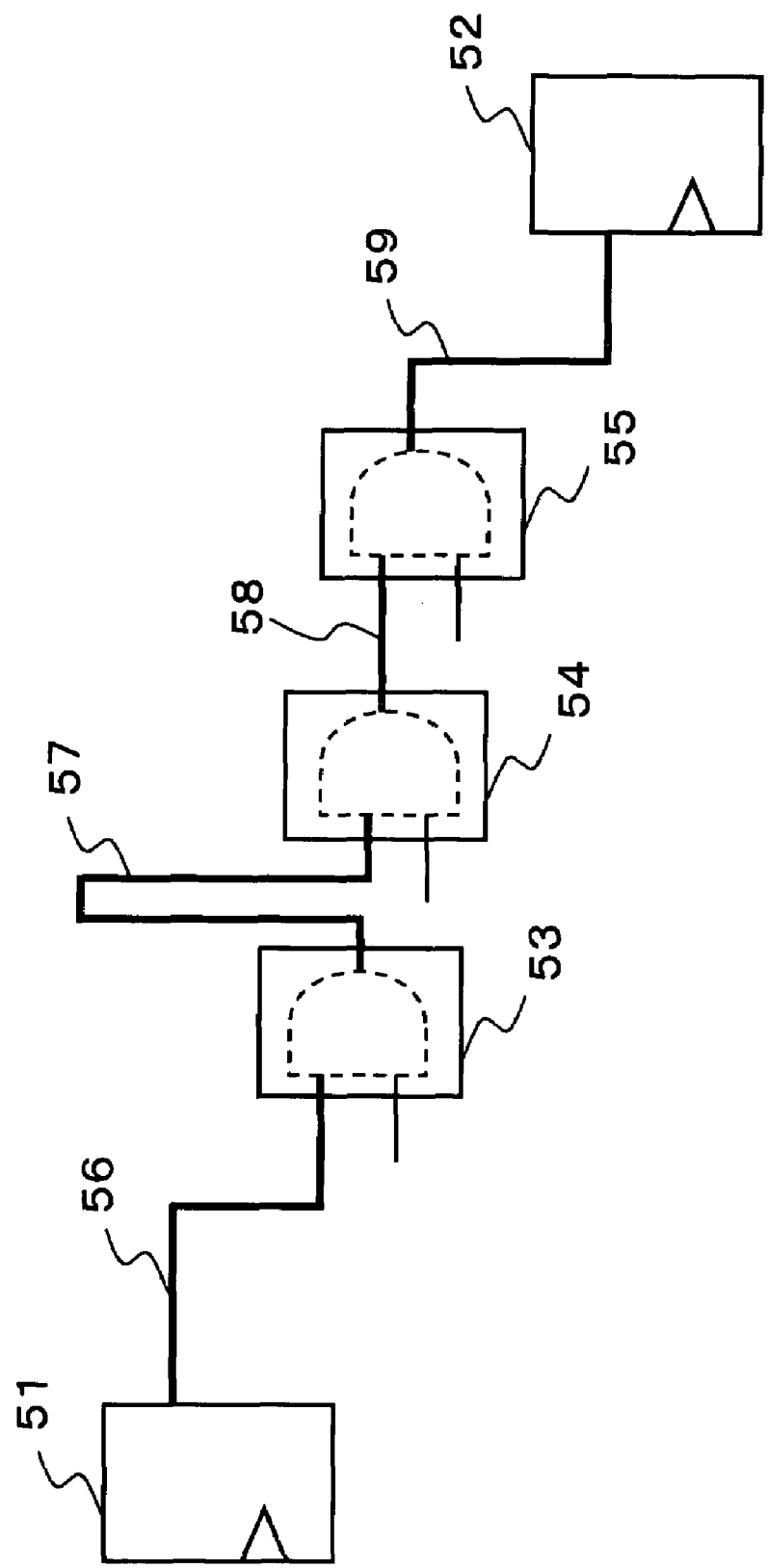
FIG. 7 is a layout chart of a semiconductor integrated circuit for describing a method of calculating wiring areas and gate areas on signal paths according to the Embodiment 2 of the present invention.

FIG. 7 is a layout chart of a semiconductor integrated circuit for describing a method of calculating wiring areas and gate areas (element areas) on respective signal paths. Numerals 51 and 52 denote flip-flops. Numerals 53-55 denote logic gates (AND logic). Numerals 56-59 denote wirings.

Figure 8:
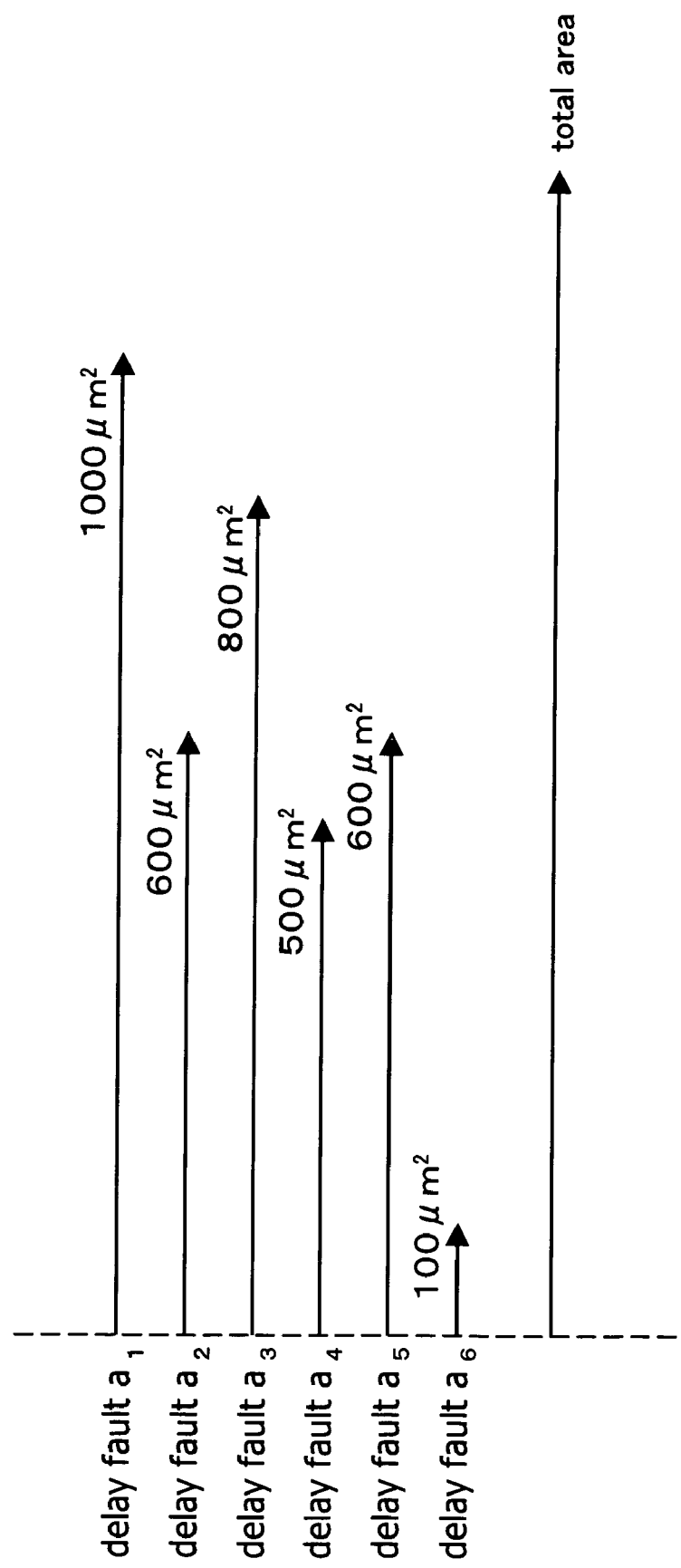
FIG. 8 is a chart showing the sums of wiring areas and gate areas on respective signal paths, on which delay faults are defined, according to the Embodiment 2 of the present invention.

FIG. 8 is a chart showing the sums of wiring areas and gate areas on respective signal paths, on which delay faults $a_1$-$a_6$ are defined. The lengths of arrows extending from the delay faults $a_1$-$a_6$ respectively denote the levels of the summed areas on the "signal paths on which the respective delay values are defined". Numbers appended to the respective arrows such as 800 μm² respectively show the specific values thereof.

Figure 9:
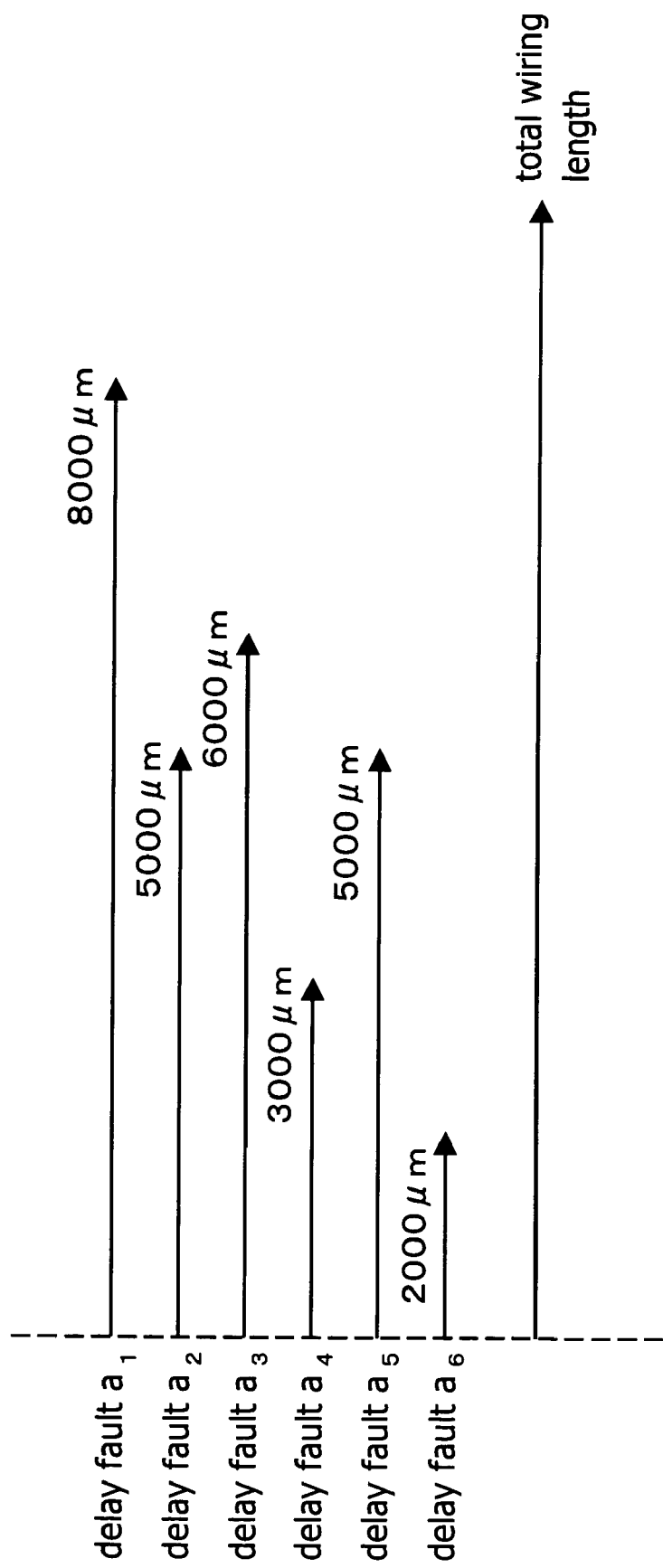
FIG. 9 is a chart showing the total of wiring lengths on respective signal paths, on which delay faults are defined, according to the Embodiment 2 of the present invention.

FIG. 9 is a chart showing the total of wiring lengths on respective signal paths, on which delay faults $a_1$-$a_6$ are defined. The lengths of arrows extending from the delay faults $a_1$-$a_6$ respectively denote the total of the wiring lengths on the delay fault defined signal paths". Numbers appended to the respective arrows such as 5000 μm² respectively show the specific values thereof.

Figure 10:
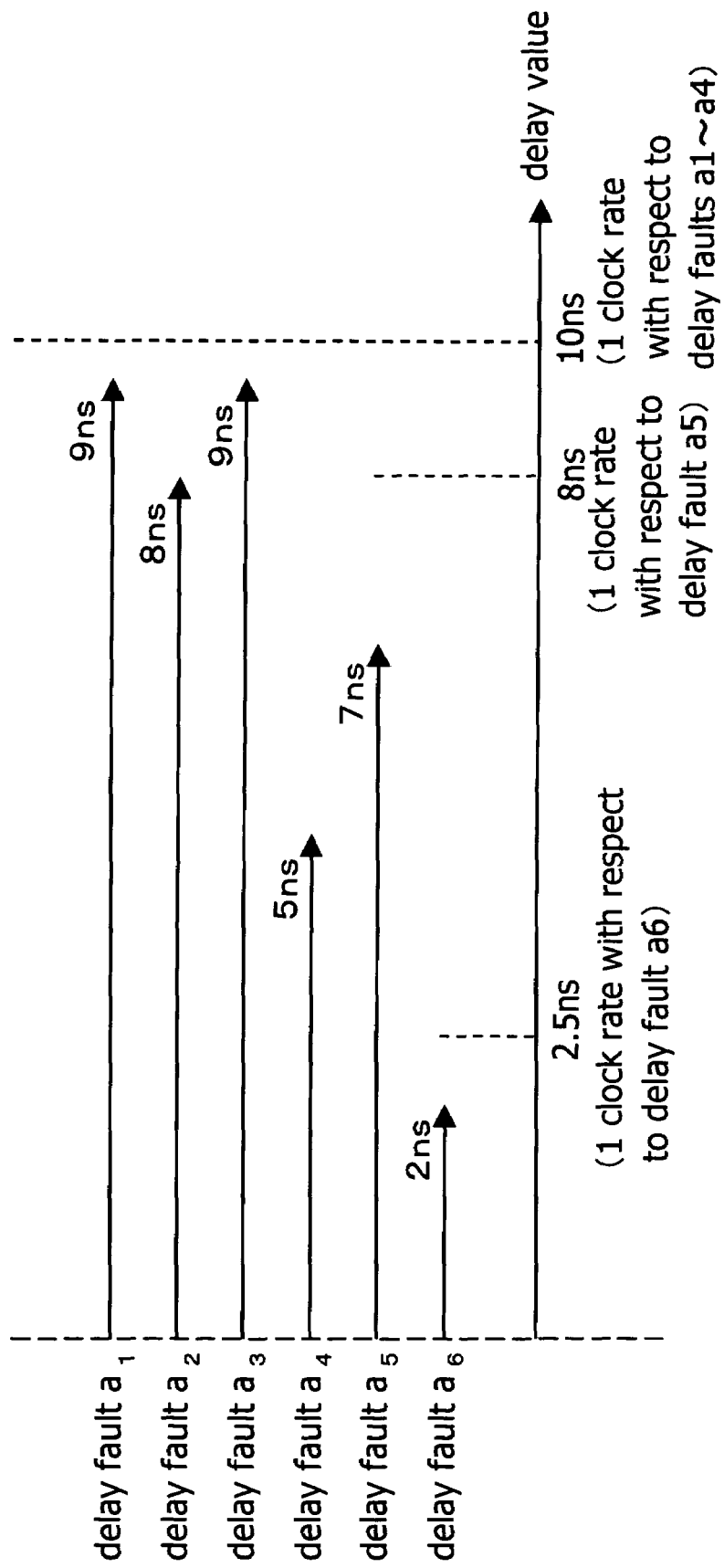
FIG. 10 is a chart showing the characteristics of delay faults defined on a semiconductor integrated circuit according to the Embodiment 2 of the present invention.

FIG. 10 is a chart showing the characteristics of delay faults defined on a semiconductor integrated circuit. Any numeral shown therein corresponds to the component with the same numeral appended thereto in FIG. 5. The values of one clock rate with respect to the delay faults $a_1$-$a_4$, $a_5$, and $a_6$ are respectively 10 ns, 8 ns, and 2.5 ns, which are shown in dotted lines in FIG. 10.

Figure 11:
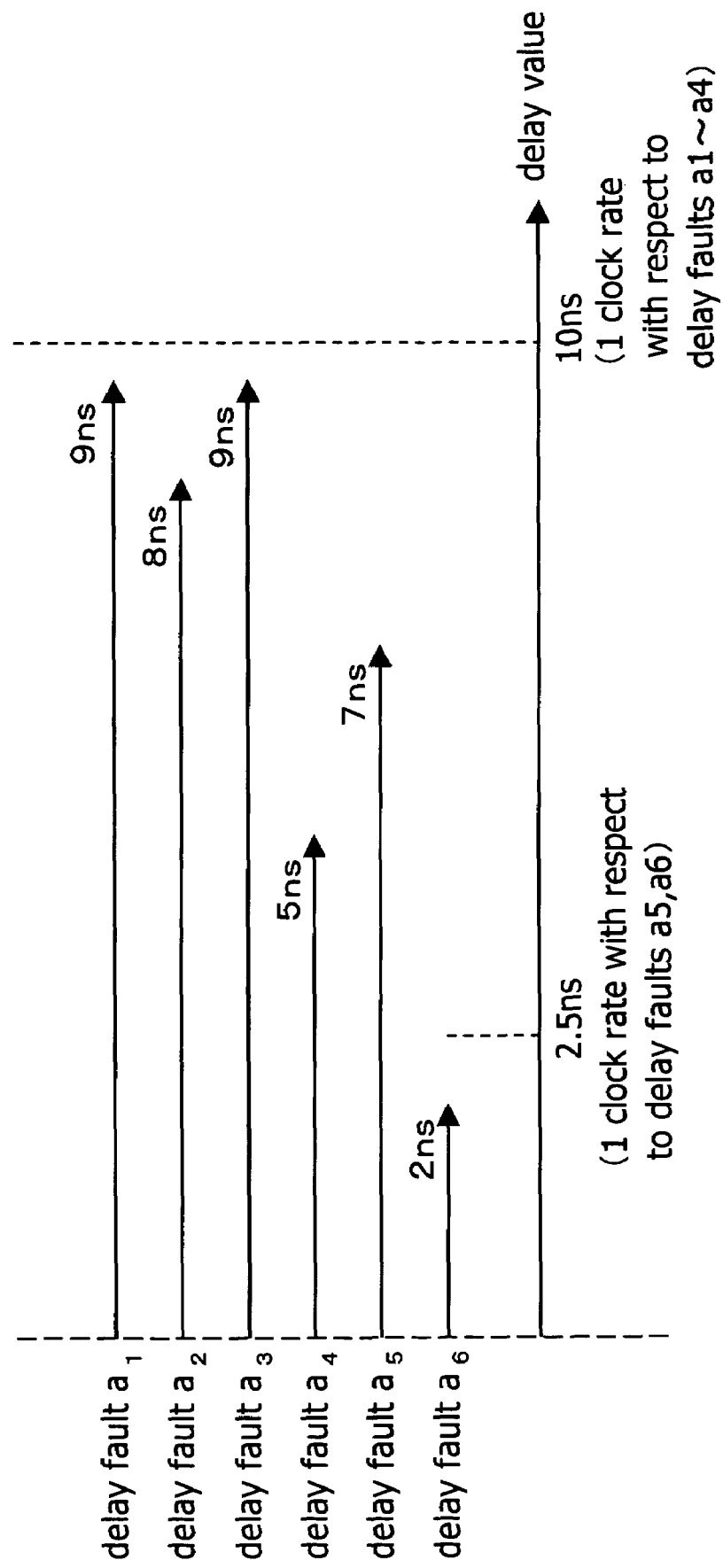
FIG. 11 is a chart showing the characteristics of the delay faults defined on the semiconductor integrated circuit according to the Embodiment 2 of the present invention.

FIG. 11 is a chart showing the characteristics of the delay faults defined on the semiconductor integrated circuit. Any numeral shown therein corresponds to the component with the same numeral appended thereto in FIG. 5. The values of one clock rate with respect to the delay faults $a_1$-$a_4$, $a_5$-$a_6$ are respectively 10 ns and 2.5 ns, which are shown in dotted lines in FIG. 11. The signal path, on which the delay fault $a_5$ is defined, is, what is termed, a multicycle path having three cycles allowing a signal to propagate in three clock periods.

Hereinafter, the Embodiment 2 is described referring to FIGS. 1, 3, 5, 7, 8, 9, 10, and 11.

Overall operation of the "method of generating the delay fault test sequences" of FIG. 1 is carried out in the same manner as in the Embodiment 1, therefore is not described in this embodiment. The specifics in the "operation of test sequence generation for delay faults" 3 are described here.

The test sequences are generated for all the given faults provided by a "defined delay fault information" 2. In the "operation of test sequence generation" 33, therefore, the test sequences are generated for the delay faults $a_1$-$a_6$, and, in this case, are successfully generated (meaning that the faults are detected) for the delay faults $a_4$-$a_6$.

Next, in the operation 37, the total of the weights with respect to the delay faults $a_1$-$a_6$, which are "all the defined faults", and the total of the weights with respect to the delay faults $a_4$-$a_6$ detected in the "operation of test sequence generation" 33 are respectively calculated. Then, the fault coverage is calculated according to the formula 15.

Specific examples of the weight are described referring to the case of using the "design delay values on the delay fault defined signal paths" as shown in FIG. 5.

SPECIFIC EXAMPLE 1 OF WEIGHT

A specific example of the weight is described referring to the case of using a relative value of the "design delay value on the delay fault defined signal path" with respect to each "timing design request value on the delay fault defined signal path". The "timing design request value on the delay fault defined signal path" is a value of time limit such that propagation of a signal in the delay fault defined signal path must be terminated within a certain time frame. The value is represented, for example, by a value of the clock rate with respect to the delay fault defined signal path or the product of the clock rate value and the number of multicycles with respect to the delay fault defined signal path when the path is the multicycle path. Here, the clock rate is used as the "timing design request value on the delay fault defined signal path" to describe the weight.

For example, the weight with respect to the delay fault $a_1$ employs a value 9 since the "design delay value on the signal path", on which the fault $a_1$ is defined, is 9 ns. In this case, the total of the weights with respect to "all the defined faults" calculated in the operation 37 is:

(9+8+9+5+7+2)=40

The total of the weights with respect to the delay faults $a_4$-$a_6$ detected in the "operation of test sequence generation" 33 is:

(5+7+2)=14

Therefore, the fault coverage is calculated according to the formula 15 as:

($^{14}/_{40}$)×100=35%

In this example, because the detected delay faults have the relatively small "design delay values", the fault coverage is smaller than the fault coverage of 50% calculated according to the conventional technology. This proves that this embodiment achieves a more accurate "method of evaluating the quality of the delay fault test sequences".

Further, unlike in the Embodiment 1, the faults on the signal paths having the smaller "design delay values", such as the delay fault $a_6$, are not neglected. The respective "design delay values on the delay fault defined signal paths" are reflected on the fault coverage. Therefore, this embodiment can offer even a more accurate "method of evaluating the quality of the delay fault test sequences" than the Embodiment 1.

This embodiment employs the relative values of the "design delay values on the signal paths" in which faults are defined with respect to the clock rate (10 ns). Also, an absolute "delay value on the delay fault signal path", irrespective of the clock rate, can be used as the weight to result in the same effect.

SPECIFIC EXAMPLE 2 OF WEIGHT

Another specific example of the weight is described. This example includes the delay values on the "delay fault signal paths" and the likelihood of actual failure in the respective signal paths. In this example, the weight represented by the following formula 16 is used.

Formula 16

$$weight = \frac{design\ delay\ value}{signal\ path\ on} \times \frac{defect\text{-}occurring}{rate} \times coefficient$$

A value of the defect-occurring rate multiplied by the coefficient can be regarded as a defect-occurring frequency.

The defect-occurring rate is further denoted according to the following formula 17.

Formula 17

$$defect\text{-}occurring\ rate = defect\ density \times \frac{wiring\ area}{+\ gate\ area}$$

Taking FIG. 7 as an example, the wiring areas plus gate areas are calculated from the sum of the total area of the wirings 56-59 on the signal paths between flip-flops 51 and 52 and the total area of the gates 53-55. FIG. 8 shows values calculated as the wiring areas plus gate areas on the signal paths, on which the delay faults $a_1$-$a_6$ are defined.

A value of the coefficient in the formula 16 is one in this embodiment. The defect density in the formula 17 is statistically calculated from a yield analysis in a factory or the like, and represented by α in this embodiment.

When the value α is hypothetically constant on the semiconductor integrated circuit, the fault coverage, based on the formulas 15-17, is calculated according to the following formula 18.

Formula 18

$$fault\ coverage = \frac{Total\ of\ \left\{ \begin{array}{c} delay\ values\ of \\ detected\ faults \end{array} \times \begin{array}{c} (wiring\ area\ + \\ gate\ area) \end{array} \right\}}{Total\ of\ \left\{ \begin{array}{c} delay\ values\ of \\ all\ defined \\ faults \end{array} \times \begin{array}{c} (wiring\ area\ + \\ gate\ area) \end{array} \right\}} \times 100\ (\%)$$

For example, the weight with respect to the delay fault $a_1$ is calculated using 9 ns, the "design delay value on the signal path" in which the delay fault $a_1$ is defined according to FIG. 5, and 1000 μm², the value of the wiring area plus gate area on the signal path according to FIG. 8 is:

9×1000=9000

Therefore, the total of the weights with respect to "all the defined faults" calculated in the operation 37 is:

(9×1000+8×600+9×800+5×500+7×600+2×100)=27900

The total of the weights with respect to the delay faults $a_4$-$a_6$ detected in the "operation of test sequence generation" 33 is:

(5×500+7×600+2×100)=6900

The fault coverage is calculated according to the formula 18 as:

6900/27900×100=24.7%

In this example, because many of the detected delay faults have the smaller "design delay values", the fault coverage is lower than the fault coverage of 50% calculated according to the conventional technology. This proves that this embodiment achieves a more accurate "method of evaluating the quality of the delay fault test sequences".

Further, unlike in the Embodiment 1, the faults on the signal paths having the smaller "design delay values", such as the delay fault $a_6$, are not neglected. The respective "design delay values on the delay fault defined signal paths" are reflected on the fault coverage. Therefore, this embodiment can offer even a more accurate "method of evaluating the quality of the delay fault test sequences" than the Embodiment 1.

SPECIFIC EXAMPLE 3 OF WEIGHT

Still another specific example of the weight is described. This example employs, in place of the wiring area plus gate area in the formula 17, a simpler value which is the total of the wiring lengths. In this case, the weight represented by the following formula 19 is used.

Formula 19

$$\text{detect-occurring rate} = \frac{\text{defect}}{\text{density}} \times \frac{\text{total of wiring lengths}}{\text{on signal paths}}$$

The total of the wiring lengths in the formula 19 is calculated by summing the lengths of the wirings 56-59 in FIG. 7. FIG. 9 shows a value of the thus calculated total wiring length on the signal paths, on which the delay faults $a_1$-$a_6$ are defined.

By replacing the formula 17 with the formula 19, the formula 18, when the defect density α is hypothetically constant on the semiconductor integrated circuit, can be replaced by the following formula 20.

Formula 20

$$\text{fault coverage} = \frac{\text{Total of }\left\{\text{delay values} \times \dfrac{\text{Total}}{\text{wiring}}\right\} \text{of detected faults}}{\text{Total of }\left\{\text{delay values} \times \dfrac{\text{Total wiring}}{\text{length}}\right\} \text{of all defined faults}} \times 100\ (\%)$$

For example, the weight with respect to the delay fault $a_1$ is calculated using 9 ns, the "design delay value on the signal path" in which the delay fault $a_1$ is defined according to FIG. 5, and 8000 μm, the value of the total wiring length on the signal path according to FIG. 9 as:

9×8000=72000

Therefore, the total of the weights with respect to "all the defined faults" calculated in the operation 37 is:

(9×8000+8×5000+9×6000+5×3000+7×5000+2×2000)
=220000

The total of the weights with respect to the delay faults $a_4$-$a_6$ detected in the "operation of test sequence generation" 33 is:

(5×3000+7×5000+2×2000)=54000

Therefore, the fault coverage is calculated according to the formula 20 as:

54000/220000×100=24.5%

In this example, because the detected delay faults have the smaller "design delay values", the fault coverage is smaller than the fault coverage of 50% calculated according to the conventional technology. This proves that this embodiment achieves a more accurate "method of evaluating the quality of the delay fault test sequences".

Further, unlike in the Embodiment 1, the faults on the signal paths having smaller "design delay values", such as the delay fault $a_6$, are not neglected. The respective "design delay values on the delay fault defined signal paths" are reflected on the fault coverage. Therefore, this embodiment can offer even a more accurate "method of evaluating the quality of the delay fault test sequences" than the Embodiment 1. To add to the foregoing advantages, this example can employ the formula 20 instead of the formula 18, thereby reducing the calculated value.

SPECIFIC EXAMPLE 4 OF WEIGHT

Still another specific example of the weight is described referring to the case of the semiconductor integrated circuit having a plurality of clock rates or multicycle paths, wherein the "timing design request value on the delay fault defined signal path" is represented by the clock rate value with respect to the delay fault defined signal path or the product of the clock rate value and the number of multicycles. Further, as the relative value of the "design delay value on the delay fault defined signal path" with respect to each "timing design request value on the delay fault defined signal path", a value represented by the ratio of the "design delay value on the delay fault defined signal path" to the "timing design request value on the delay fault defined signal path" (specifically, clock rate value or the product of the clock rate and number of multicycles) is used to describe the example.

For example, as shown in FIG. 10, when the clock rate of the signal paths, on which the delay faults $a_1$-$a_4$ are defined, is 10 ns, the "timing design request value on the signal path", on which the delay fault $a_1$ is defined, can be regarded as 10 ns. Then, the weight with respect to the delay fault $a_1$ is represented by the ratio of the "design delay value on the signal path", on which the delay fault $a_1$ is defined, to the "timing design request value", that is 9 ns/10 ns=0.9. The clock rates of the delay faults $a_5$ and $a_6$ are respectively 8 ns and 2.5 ns. Therefore the weights with respect to the delay faults $a_5$ and $a_6$ are, likewise, respectively represented by (7 ns/8 ns)=0.875 and (2 ns/2.5 ns)=0.8. In this case, the total of the weights with respect to "all the defined faults" calculated in the operation 37 is:

(0.9+0.8+0.9+0.5+0.875+0.8)=4.775

The total of the weights with respect to the delay faults $a_4$-$a_6$ detected in the "operation of test sequence generation" 33 is:

(0.5+0.875+0.8)=2.175

The fault coverage is calculated according to the formula 15 as:

(2.175/4.775)=45.5%

Moreover, as shown in FIG. 11, when the clock rate of the signal path, on which the delay fault $a_5$ is defined, is 2.5 ns, while the signal path is the multicycle path having three cycles, the "timing design request value on the signal path, on which the delay fault $a_5$ is defined, can be regarded as (2.5 ns×3)=7.5 ns. In this case, the weight with respect to the delay fault $a_5$ is represented by (7 ns /7.5 ns)=0.933. The weights with respect to the delay faults $a_1$-$a_4$ and $a_6$ of FIG. 11 are the same as in FIG. 10, therefore the total of the weights with respect to "all the defined faults" calculated in the operation 37 is:

(0.9+0.8+0.9+0.5+0.933+0.8)=4.833

The total of the weights with respect to the delay faults $a_4$-$a_6$ detected in the "operation of test sequence generation" 33 is:

(0.5+0.933+0.8)=2.233

Therefore, the fault coverage calculated according to the formula 15 is:

(2.233/4.833)=46.2%

In this example, because the detected delay faults have the smaller "design delay values", the fault coverage is smaller than the fault coverage of 50% calculated according to the conventional technology. This proves that this embodiment achieves a more accurate "method of evaluating the quality of the delay fault test sequences"

Further, unlike in the Embodiment 1, the faults on the signal paths having smaller "design delay values", such as the delay fault $a_6$, are not neglected. The respective "design delay values on the delay fault defined signal paths" are reflected on the fault coverage. Therefore, this embodiment can offer even a more accurate "method of evaluating the quality of the delay fault test sequences" than the Embodiment 1.

The clock rate and multicycle path are exemplified in describing this example, while the same effect can be evidently achieved by using other general timing-limit values, such as an AC timing value between an external terminal and the inside of the semiconductor integrated circuit.

Further, the same effect can be evidently achieved by means of FIG. 2 instead of FIG. 1 described in this embodiment, and likewise, by means of the "operation of fault simulation exercise" 36 instead of the "operation of test sequence generation" 33.

When the wiring area plus gate area in the formulas 17 and 18 is replaced by wiring area alone, the substantially same effect can be achieved.

When the "design delay value on the signal path" used in this embodiment is replaced by the gate stage number with respect to the signal path as a simplified method of representing the delay value, the substantially same effect can be achieved.

Embodiment 3

Figure 12:
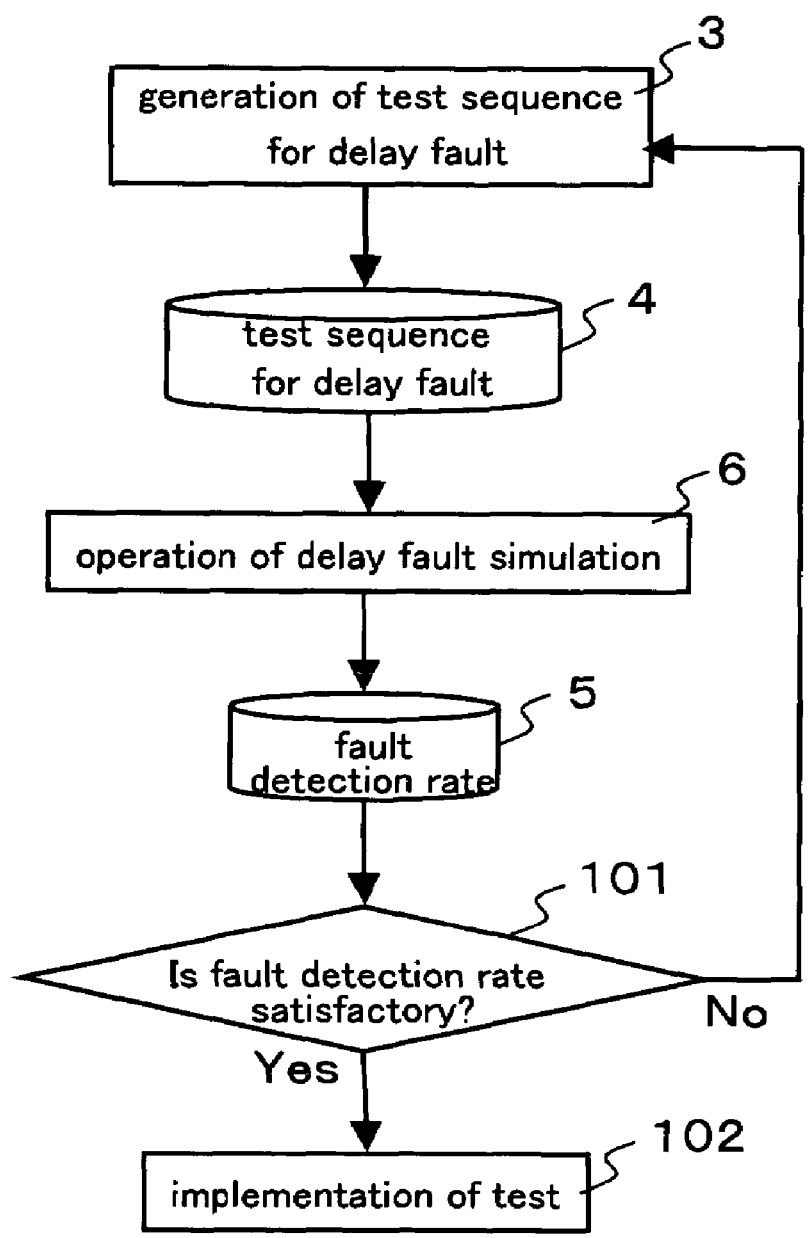
FIG. 12 is a flow chart illustrating a method of testing faults according to an Embodiment 3 of the present invention.

FIG. 12 is a flow chart illustrating a method of testing faults according to an Embodiment 3.

Numerals 3-6 refer to the same components with the same numerals appended thereto in FIGS. 1 and 2. A numeral 101 denotes operation of judgment whether or not a fault coverage satisfies the demand of a test. A numeral 102 denotes a fault test.

Referring to FIGS. 3, 4, 6, and 12, the Embodiment 3 is described.

First, "test sequences for delay faults" 4 used for the test in "operation of test sequence generation for delay faults" 3 is generated.

Next, a fault coverage 5 of the "delay fault test sequences" 4 is calculated in "operation of delay fault simulation" 6. More particularly, the fault coverage is calculated by using the methods described in the Embodiments 1 and 2 (wherein the operation 33 in FIGS. 3 and 6 is replaced by the operation 36).

Then, in the operation 101, the fault coverage 5 output from the "operation of delay fault simulation" 6 is used to judge whether or not the fault coverage satisfies a value demanded by the test. When the result is positive, YES, move on to the fault test 102. On the contrary, when the result is negative, NO, go back to the "operation of test sequence generation for delay faults" 3 and start over again, thereby generating again the "delay fault test sequences" having a higher fault coverage.

When a fault coverage according to the conventional technology is used, a value of the fault coverage alone cannot guarantee a satisfactorily high quality of the "delay fault test sequences" though the rate is relatively high. In other words, complementary test sequences or review of the test methods become necessary, which, however, may result in an increased number of operating steps in connection with the fault test and further instability in the quality of the fault test.

On the other hand, when the "methods of evaluating the quality of the delay fault test sequences" according to the present invention are used, the calculated fault coverage represents the quality of the "delay fault test sequences" with a good accuracy. This helps to decide more easily whether or not the operation of the fault test should be commenced. Thus, the number of operating steps in connection with the fault test can be reduced, and the quality of the fault test can be constantly maintained at a high level.

As thus far described, according to the present invention, the different levels of importance in the delay faults can be reflected on the quality evaluation for the "delay fault test sequences" by taking into account the "design delay values" on the delay fault defined signal paths. As a result, the quality evaluation for the "delay fault test sequences" can be more accurate. Further, the delay faults having a higher likelihood of actual failure can have a larger impact on the fault coverage. More specifically, the detection of such delay faults can contribute to an improvement of the fault coverage, while the failure to detect such delay faults can contribute to a decline of the fault coverage.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A method of evaluating the quality of test sequences for delay faults, wherein:
    each of defined delay faults which are delay faults assumed to exist in a semiconductor integrated circuit is assigned a predetermined delay value; and
    the result of the total of the delay values of the "delay faults detected by the test sequences for delay faults" divided by the predetermined delay values of the defined delay faults is set as a fault coverage, thereby evaluating the quality of the "test sequences for delay faults".

2. A method of evaluating the quality of test sequences for delay faults as claimed in claim 1, wherein the result of a "design delay value on a signal path on which a delay fault is defined" divided by "timing design request value on the delay fault defined signal path" is used as the predetermined delay value.

3. A method of evaluating the quality of test sequences for delay faults as claimed in claim 2, wherein a clock rate with respect to the delay fault defined signal path is used for the "timing design request value on the delay fault defined signal path".

4. A method of evaluating the quality of test sequences for delay faults as claimed in claim 1, wherein a "gate stage number with respect to the delay fault defined signal path" is used as the predetermined delay value.

5. A method of evaluating the quality of test sequences for delay faults as claimed in claim 4, wherein a defect density is further used for multiplication as the predetermined delay value.

6. A method of evaluating the quality of test sequences for delay faults as claimed in claim 1, wherein the product of the "design delay value on the delay fault defined signal path" and a "physical path length on the delay fault defined signal path" is used as the predetermined delay value.

7. A method of evaluating the quality of test sequences for delay faults as claimed in claim 6, wherein a defect density is further used for multiplication as the predetermined delay value.

8. A method of evaluating the quality of test sequences for delay faults as claimed in claim 1, wherein the product of the "design delay value on the delay fault defined signal path" and a "physical wiring area on the delay fault defined signal path" is used as the predetermined delay value.

9. A method of evaluating the quality of test sequences for delay faults as claimed in claim 8, wherein a defect density is further used for multiplication as the predetermined delay value.

10. A method of evaluating the quality of test sequences for delay faults as claimed in claim 1, wherein the product of the "design delay value on the delay fault defined signal path" and the sum of a "physical path area on the delay fault defined signal path" and an element area thereon is used as the predetermined delay value.

11. A method of evaluating the quality of test sequences for delay faults as claimed in claim 10, wherein a defect density is further used for multiplication as the predetermined delay value.

12. A method of evaluating the quality of test sequences for delay faults having a step of generating test sequences for delay faults, wherein the "method of evaluating the quality of test sequences for delay faults" as claimed in claim 1 is applied to "test sequences for delay faults" generated in the step of generating test sequences for delay faults, to thereby calculate a fault coverage.

13. A method of simulating the quality of test sequences for delay faults, wherein the "method of evaluating the quality of test sequences for delay faults" as claimed in claim 1 is applied to the given "test sequences for delay faults", to thereby calculate a fault coverage.

14. A method of testing faults, wherein the "method of evaluating the quality of test sequences for delay faults" as claimed in claim 1 is applied to the "test sequences for delay faults" used for a test in testing steps of a semiconductor integrated circuit, to thereby calculate a fault coverage and determine whether the fault coverage satisfies a required value.

15. A method of evaluating the quality of test sequences for delay faults as claimed in claim 1, wherein a ratio of the "design delay value on the delay fault defined signal path" to the "timing design request value on the delay fault defined signal path" is used as the predetermined delay value.

16. A method of evaluating the quality of test sequences for delay faults as claimed in claim 15, wherein the clock rate with respect to the delay fault defined signal path is used for the "timing design request value on the delay fault defined signal path".

17. A method of evaluating the quality of test sequences for delay faults as claimed in claim 15, wherein when the delay fault defined signal path is a multicycle path, the product of the clock rate with respect to the delay fault defined signal path and the number of the multicycles is used for the "timing design request value on the delay fault defined signal path".

18. A method of evaluating the quality of test sequences for delay faults including steps of:
  assigning a predetermined delay value to each of defined delay faults which are delay faults assumed to exist in a semiconductor integrated circuit;
  determining a fault coverage by dividing the total of the delay values of the "delay faults detected by the test sequences for delay faults" by the total of the predetermined delay values of the defined delay faults; and
  evaluating the quality of the "test sequences for delay faults" based on the fault coverage.

* * * * *